(12) United States Patent
Choi

(10) Patent No.: US 9,973,162 B2
(45) Date of Patent: May 15, 2018

(54) SYSTEM AND METHOD FOR INTERLEAVING DIGITAL AUDIO SIGNAL INCLUDING PWM SIGNAL AND DIGITAL AUDIO PROCESSING DEVICE EMPLOYING THE SAME

(71) Applicant: NEOFIDELITY, INC., Gyeonggi-do (KR)

(72) Inventor: Yeongha Choi, Seoul (KR)

(73) Assignee: N CITRON, INC., Gyeonggi-Do (KR)

( * ) Notice: Subject to any disclaimer, the term of this patent is extended or adjusted under 35 U.S.C. 154(b) by 0 days. days.

(21) Appl. No.: 15/462,074

(22) Filed: Mar. 17, 2017

(65) Prior Publication Data
US 2017/0359043 A1    Dec. 14, 2017

(30) Foreign Application Priority Data
Jun. 8, 2016  (KR) .................. 10-2016-0070736

(51) Int. Cl.
*H03G 3/00*    (2006.01)
*H03G 5/00*    (2006.01)

(52) U.S. Cl.
CPC .............. *H03G 3/002* (2013.01); *H03G 5/005* (2013.01)

(58) Field of Classification Search
None
See application file for complete search history.

(56) References Cited

U.S. PATENT DOCUMENTS

2017/0294888 A1* 10/2017 Berkhout ............. H03G 3/3015

FOREIGN PATENT DOCUMENTS

KR    10-1037167 B1    5/2011

* cited by examiner

*Primary Examiner* — Curtis A Kuntz
*Assistant Examiner* — Kenny H Truong
(74) *Attorney, Agent, or Firm* — Stein IP, LLC

(57) ABSTRACT

A system, a method for interleaving a digital audio signal including a PWM signal, and a digital audio processing device employing the same in accordance with the present invention are disclosed. The system, the method and the digital audio processing device is capable of minimizing the interference with an RF signal such as an AM signal or an FM signal by interleaving the digital audio signal including the PWM signal.

19 Claims, 15 Drawing Sheets

<PRIOR ART>

<PRIOR ART>

SYSTEM AND METHOD FOR INTERLEAVING DIGITAL AUDIO SIGNAL INCLUDING PWM SIGNAL AND DIGITAL AUDIO PROCESSING DEVICE EMPLOYING THE SAME

CROSS-REFERENCE TO RELATED PATENT APPLICATION

This U.S. non-provisional patent application claims priority under 35 U.S.C. § 119 of Korean Patent Application No. 10-2016-0070736 filed on Jun. 8, 2016 in the Korean Intellectual Property Office, the entire contents of which are hereby incorporated by reference.

BACKGROUND

1. Field

The present invention relates to a system and a method for interleaving a digital audio signal including a PWM signal, and a digital audio processing device employing the same, and more particularly, to a system and a method for interleaving a digital audio signal including a PWM signal capable of reducing an interference with an RF signal, and a digital audio processing device employing the same.

2. Description of the Related Art

FIG. 1 is a block diagram illustrating a conventional digital amplifier. Referring to FIG. 1, the conventional digital amplifier includes a switch unit 10 and a low pass filter 20. For example, a PWM signal having a carrier frequency of 768 kHz is applied to the switch unit 10. Thereafter, the applied PWM signal drives a transistor included in the switch unit 10 and an output of the transistor is passed through the low pass filter 20 and drives a speaker 30.

FIG. 2 is a graph illustrating an energy spectrum of a carrier frequency. When the carrier frequency is 768 kHz, the energy spectrum appears periodically at every multiple of the carrier frequency of 768 kHz. A PWM signal causes an interference with an RF signal adjacent to the center frequency of the energy spectrum (e. g. 768 kHz, 1536 kHz and 2304 kHz in FIG. 2). For example, the energy spectrum having the center frequency of 768 kHz or 1536 kHz may cause an interference with an AM radio signal. In particular, the energy spectrum with a high peak causes greater interferences. To reduce such interferences with the RF signal, either the center frequency of the energy spectrum should be changed or the peak of the energy spectrum should be lowered. Practically, given that the energy spectrum appears at every multiple of the carrier frequency, the change to the center frequency of the energy spectrum is not facile. Therefore, the peak of the energy spectrum should be lowered to minimize interference with the RF signal.

PATENT LITERATURE

1. Korean Patent No. 10-1037167

SUMMARY

In order to solve the problem described above, it is an object of the present invention to provide a system and a method for interleaving a digital audio signal including a PWM signal capable of reducing interference caused by a PWM signal, and a digital audio processing device employing the same.

According to one aspect of the present invention, there is provided a method for interleaving a digital audio signal including a first PWM signal having a carrier frequency of f, the method comprising: (a) generating a second PWM signal having a carrier frequency of f/m by dividing the carrier frequency of the first PWM signal by m; (b) generating a third PWM signal by extracting $(2 \times m \times n+1)^{th}$ frame through $(2 \times m \times n+m)^{th}$ frame from the first PWM signal and $(2n+2)^{th}$ frame from the second PWM signal; and (c) reproducing the digital audio signal by driving a switch with the third PWM signal (where $m=2^k$, and each of n and k is an integer equal to or greater than 0).

According to another aspect of the present invention, there is provided a method for interleaving a digital audio signal including a first PWM signal having a period of $T_1$, the method comprising: (a) generating a second PWM signal having a period of $T_2$ by frequency-dividing the first PWM signal by m; (b) extracting, from the first PWM signal, $(2 \times m \times n+1)^{th}$ frame through $(2 \times m \times n+m)^{th}$ frame wherein a sum of durations of the $(2 \times m \times n+1)^{th}$ frame through the $(2 \times m \times n+m)^{th}$ frame corresponding to the period of $T_2$; (c) extracting $(2n+2)^{th}$ frame from the second PWM signal; (d) generating the third PWM signal having the period of $(m \times T_1+T_2)$ by interleaving the $(2 \times m \times n+1)^{th}$ frame through the $(2 \times m \times n+m)^{th}$ frame of the first PWM signal and the $(2n+2)^{th}$ frame of the second PWM signal; and (e) reproducing the digital audio signal by driving a switch with the third PWM signal (where $T_2=m \times T_1$, $m=2^k$ and each of n and k is an integer equal to or greater than 0).

According to still another aspect of the present invention, there is provided a system for interleaving a digital audio signal including a first PWM signal having a carrier frequency of f, the system comprising: a frequency divider configured to divide the carrier frequency of the first PWM signal by m to generate a second PWM signal having a carrier frequency of f/m; a frame extracting unit configured to extract $(2 \times m \times n+1)^{th}$ frame through $(2 \times m \times n+m)^{th}$ frame from the first PWM signal and $(2n+2)^{th}$ frame from the second PWM signal; a frame arranging unit configured to interleave the $(2 \times m \times n+1)^{th}$ frame through the $(2 \times m \times n+m)^{th}$ frame of the first PWM signal and the $(2n+2)^{th}$ frame of the second PWM signal extracted by the frame extracting unit to generate a third PWM signal; and a switch unit driven by the third PWM signal (where $m=2^k$ and each of n and k is an integer equal to or greater than 0).

According to still another aspect of the present invention, there is provided a digital audio processing device comprising: a memory; a program stored in the memory; and a processor configured to execute an instruction included in the program, wherein the program comprises: a first instruction for generating a second PWM signal having a carrier frequency of f/m by frequency-dividing a first PWM signal having a carrier frequency of f, a second instruction for extracting $(2 \times m \times n+1)^{th}$ frame through $(2 \times m \times n+m)^{th}$ frame from the first PWM signal and $(2n+2)^{th}$ frame from the second PWM signal; a third instruction for generating a third PWM signal by interleaving the $(2 \times m \times n+1)^{th}$ frame through the $(2 \times m \times n+m)^{th}$ frame of the first PWM signal and the $(2n+2)^{th}$ frame of the second PWM signal; and a fourth instruction for driving a switch with the third PWM signal (where $m=2^k$ and each of n and k is an integer equal to or greater than 0).

According to still another aspect of the present invention, there is provided a method for interleaving a digital audio signal including a first PWM signal having a carrier frequency of f, the method comprising: (a) generating a second PWM signal having a carrier frequency of f/m by frequency-dividing the first PWM signal; (b) generating a third PWM signal by extracting $(2n+1)^{th}$ frame from the second PWM signal and $(2 \times m \times n+m+1)^{th}$ frame through $(2 \times m \times n+2m)^{th}$ frame from the first PWM signal; and (c) reproducing the digital audio signal by driving a switch with the third PWM signal (where $m=2^k$ and each of n and k is an integer equal to or greater than 0).

According to still another aspect of the present invention, there is provided a method for interleaving a digital audio signal including a first PWM signal having a period of $T_1$, the method comprising: (a) generating a second PWM signal having a period of $T_2$ by frequency-dividing the first PWM signal by m; (b) extracting $(2n+2)^{th}$ frame from the second PWM signal; (c) extracting, from the first PWM signal, $(2 \times m \times n+1)^{th}$ frame through $(2 \times m \times n+m)^{th}$ frame wherein a sum of durations of the $(2 \times m \times n+1)^{th}$ frame through the $(2 \times m \times n+m)^{th}$ frame corresponding to the period of $T_2$; (d) generating the third PWM signal having the period of $(m \times T_1+T_2)$ by interleaving $(2n+1)^{th}$ frame of the second PWM signal and $(2 \times m \times n+m+1)^{th}$ frame through $(2 \times m \times n+2m)^{th}$ frame of the first PWM signal; and (e) reproducing the digital audio signal by driving a switch with the third PWM signal (where $T_2=m \times T_1$, $m=2^k$, and each of n and k is an integer equal to or greater than 0).

DETAILED DESCRIPTION OF THE PREFERRED EMBODIMENTS

Hereinafter, a preferred embodiment of the present invention will be described in detail with reference to the accompanying drawings.

Figure 1:
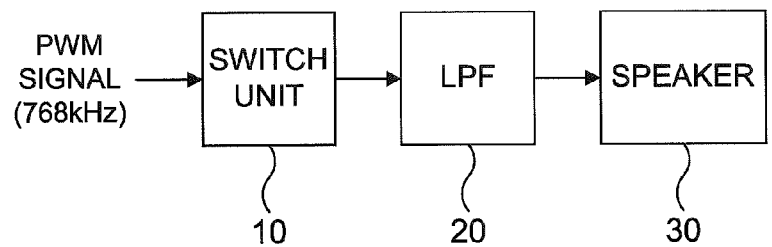
FIG. 1 is a block diagram illustrating a conventional digital amplifier.
Figure 2:
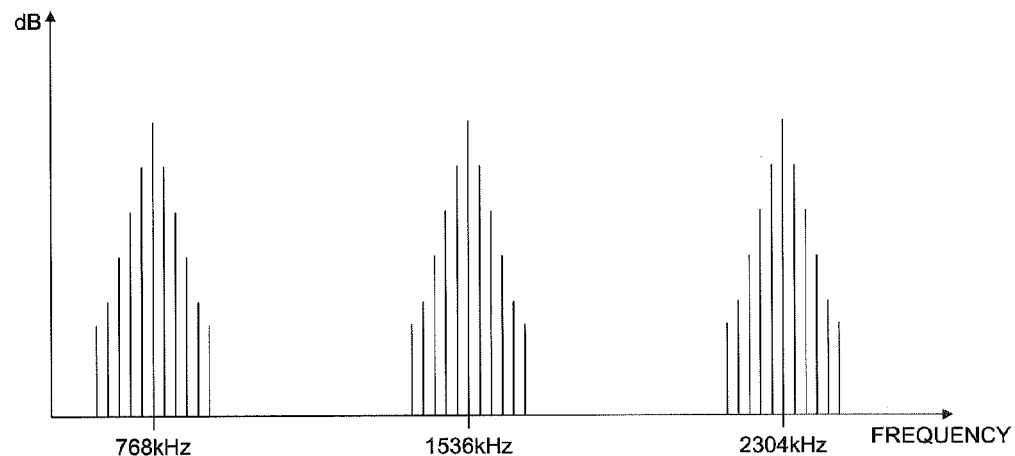
FIG. 2 is a graph illustrating an energy spectrum of a carrier frequency.
Figure 3:
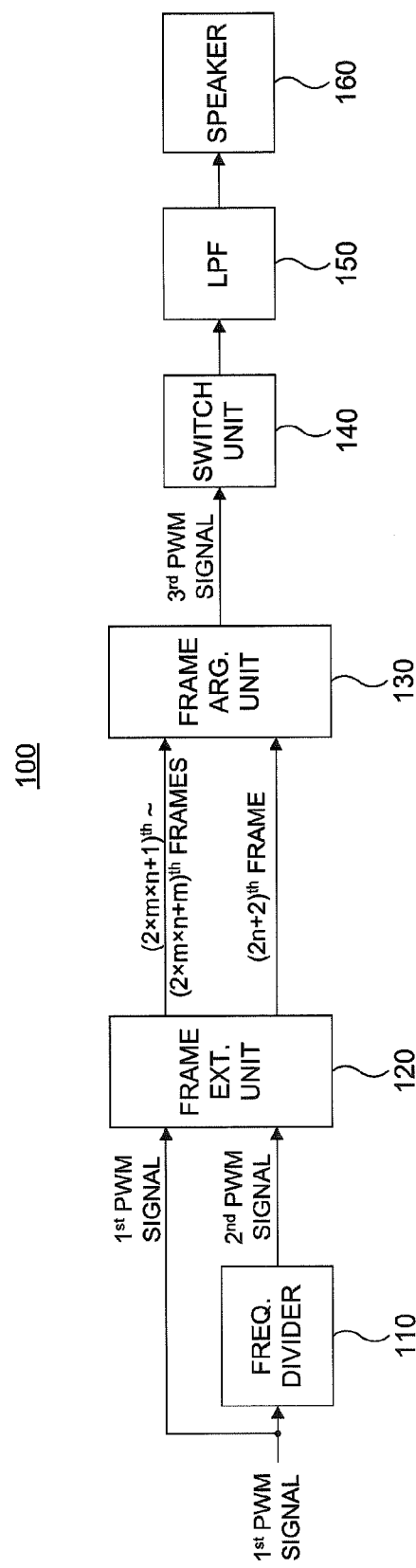
FIG. 3 is a block diagram illustrating an interleaving system according to the present invention.

FIG. 3 is a block diagram illustrating an interleaving system according to the present invention.

Referring to FIG. 3, an interleaving system 100 according to the present invention includes a frequency divider 110, a frame extracting unit 120, a frame arranging unit 130 and a switch unit 140.

The frequency divider 110 divides a carrier frequency of a first PWM signal having the carrier frequency of f to generate a second PWM signal having a carrier frequency of f/m (where $m=2^k$ and k is an integer equal to or greater than 0). The first PWM signal is included in a digital audio signal.

For example, when m=2 (k=0), the frequency divider 110 divides the carrier frequency of the first PWM signal to generate the second PWM signal having the carrier frequency of f/2.

The frame extracting unit 120 extracts, for each value of n, $(2 \times m \times n+1)^{th}$ frame through $(2 \times m \times n+m)^{th}$ frame from the first PWM signal and $(2n+2)^{th}$ frame from the second PWM signal generated by the frequency divider 110 (where n is an integer equal to or greater than 0).

For example, when m=2, the frame extracting unit 120 extracts, for each value of n, $(4n+1)^{th}$ frame through $(4n+m)^{th}$ frame from the first PWM signal and $(2n+2)^{th}$ frame from the second PWM signal generated by the frequency divider 110. Specifically, the frame extracting unit 120 extracts: first frame and second frame (when n=0), fifth frame and sixth frame (when n=1), ninth frame and tenth frame (when n=2), thirteenth frame and fourteenth frame (when n=3) . . . from the first PWM signal; and second frame (when n=0), fourth frame (when n=1), sixth frame (when n=2) . . . from the second PWM signal.

The frame arranging unit 130 interleaves $(2 \times m \times n+1)^{th}$ frame through $(2 \times m \times n+m)^{th}$ frame of the first PWM signal and $(2n+2)^{th}$ frame of the second PWM signal to generate a third PWM signal.

For example, when m=2, the frame arranging unit 130 arranges first frame and second frame, fifth frame and sixth frame, ninth frame and tenth frame, thirteenth frame and fourteenth frame . . . of the first PWM signal, and second frame, fourth frame, sixth frame . . . of the second PWM signal in the following sequence: first frame and second frame of the first PWM signal, second frame of the second PWM signal, fifth frame and sixth frame of the first PWM signal, fourth frame of the second PWM signal, ninth frame and tenth frame of the first PWM signal, sixth frame of the second PWM signal, thirteenth frame and fourteenth frame of the first PWM signal . . . to generate the third PWM signal.

The term "interleaving" in this specification refers to alternately arranging frames extracted from the first PWM signal and frames extracted from the second PWM signal.

The switch unit 140 is driven by the third PWM signal generated by the frame arranging unit 130 and an output of the switch unit 140 is passed through a low pass filter 150 to drive a speaker 160.

Detailed description will be given later in this specification when an interleaving method according to the present invention is described.

Figure 4:
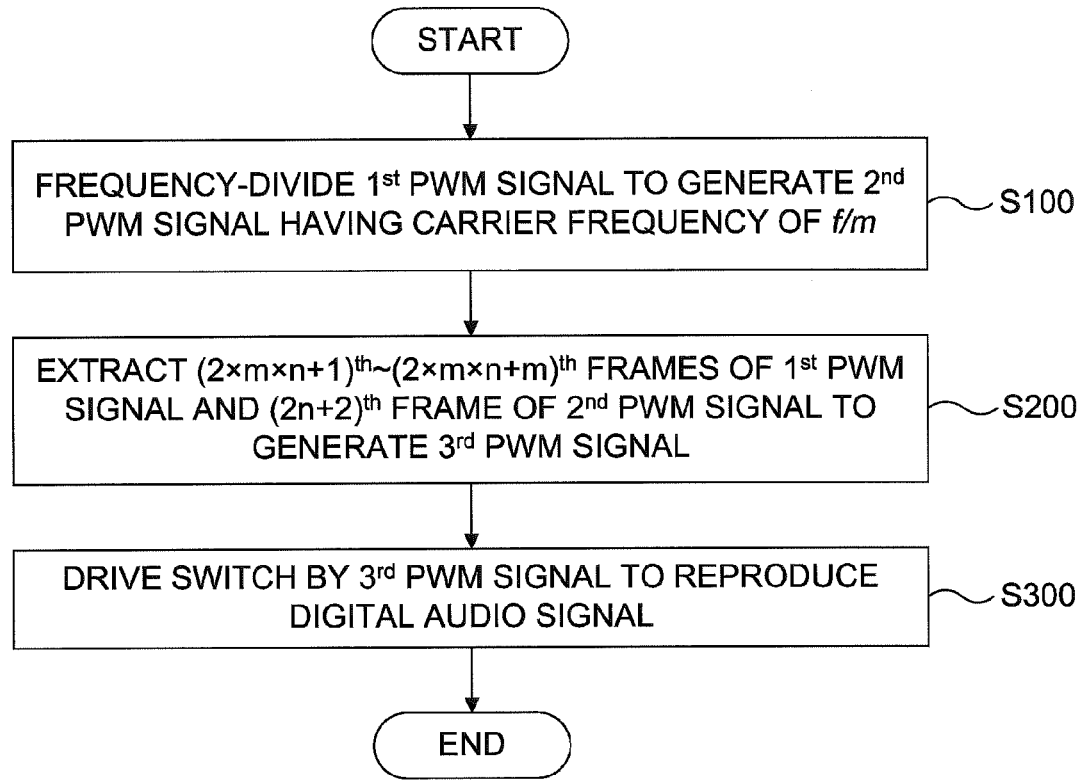
FIG. 4 is a flow diagram illustrating an interleaving method for interleaving a digital audio signal according to the present invention.
Figure 5:
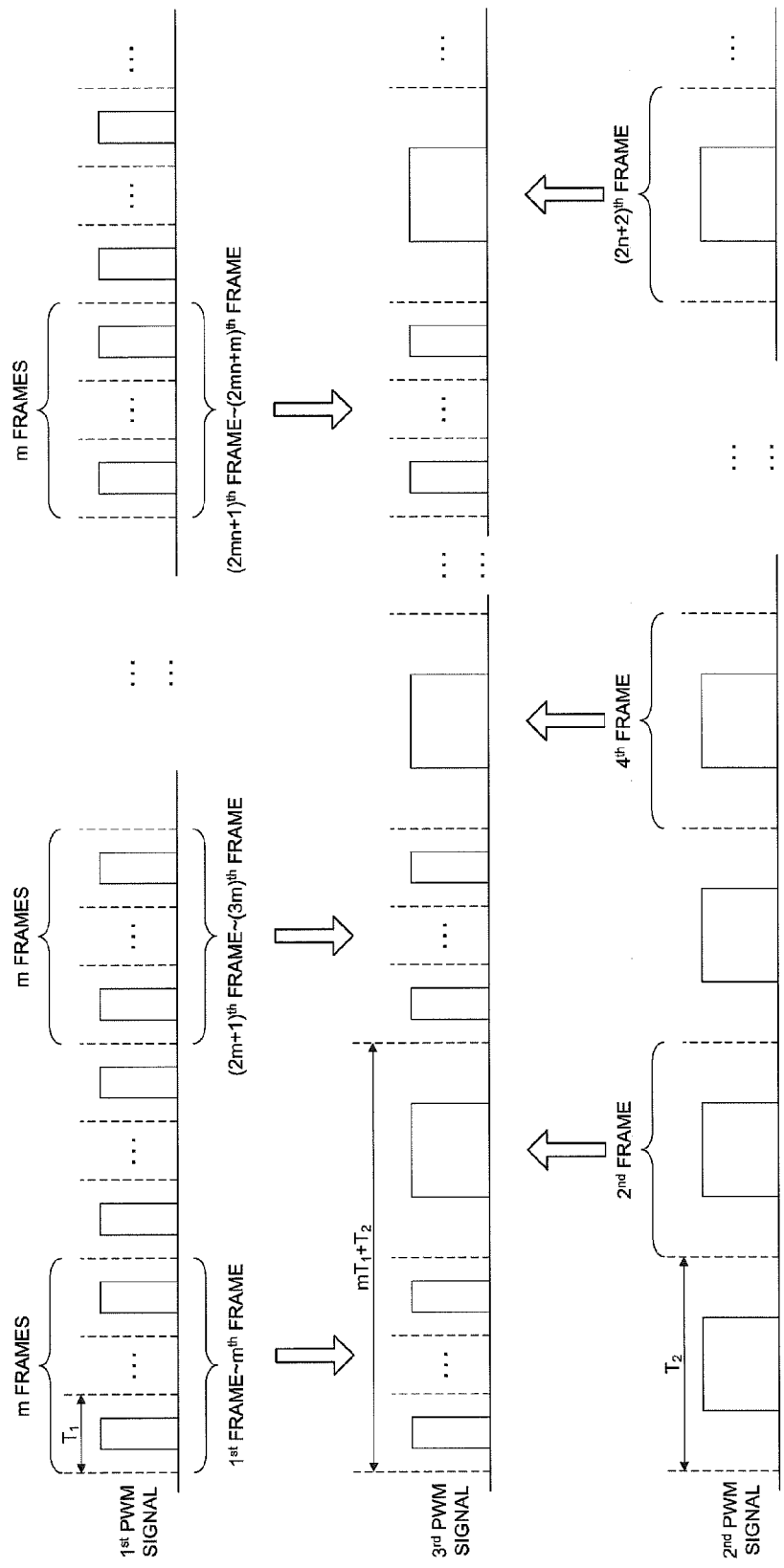
FIG. 5 is a waveform diagram illustrating an interleaving method for interleaving a digital audio signal according to the present invention.

FIG. 4 is a flow diagram illustrating an interleaving method for interleaving a digital audio signal according to the present invention, and FIG. 5 is a waveform diagram illustrating the interleaving method for interleaving the digital audio signal according to the present invention.

Referring to FIG. 4, the carrier frequency f of the first PWM signal is divided to generate the second PWM signal having the carrier frequency of f/m (S100). As shown in FIG. 5, when the carrier frequency of the first PWM signal is divided, the second PWM signal having a period of $T_2$ is generated (where $T_2 = m \times T_1$, and $T_1$ is a period of the first PWM signal).

Thereafter, $(2 \times m \times n+1)^{th}$ frame through $(2 \times m \times n+m)^{th}$ frame of the first PWM signal and $(2n+2)^{th}$ frame of the second PWM signal are extracted for each value of n to generate the third PWM signal (S200). As shown in FIG. 5, first frame to $m^{th}$ frame, $(2m+1)^{th}$ frame through $(3m)^{th}$ frame . . . and $(2mn+1)^{th}$ frame through $(2mn+m)^{th}$ frame of the first PWM signal and second frame, fourth frame . . . and $(2n+2)^{th}$ frame of the second PWM signal are extracted.

Figure 6:
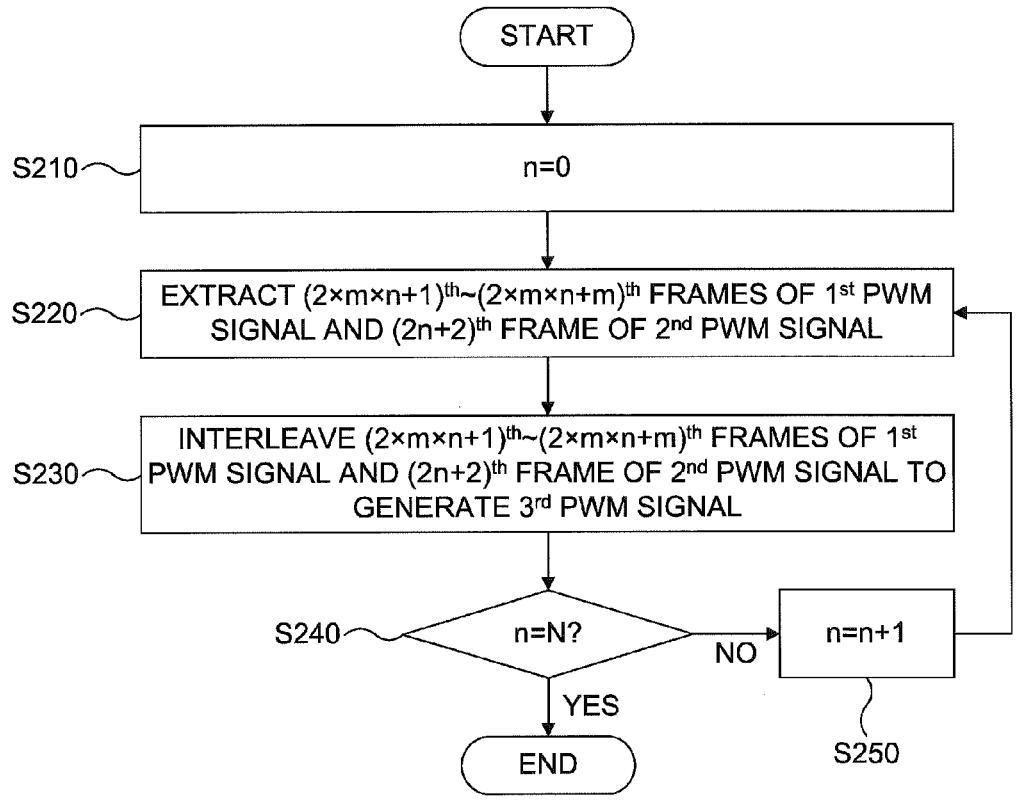
FIG. 6 is a flow diagram illustrating step S200 of FIG. 4 in detail.

The step S200 will be described in detail with reference to FIG. 6. First, for the purpose of description, it is assumed that an initial value of n (S210) is 0 and the first PWM signal consists of (2 mN+m) frames (where N is a natural number).

Since n=0, first frame to $m^{th}$ frame (m frames in total) of the first PWM signal and second frame of the second PWM signal are extracted (S220).

Thereafter, first frame to $m^{th}$ frame of the first PWM signal and second frame of the second PWM signal extracted in S220 are arranged and outputted as the third PWM signal (S230).

Thereafter, n is set to 1 (S240, S250).

Thereafter, $(2m+1)^{th}$ frame through $(3m)^{th}$ frame (m frames in total) of the first PWM signal and fourth frame of the second PWM signal are extracted (S220).

Thereafter, $(2m+1)^{th}$ frame through $(3m)^{th}$ frame of the first PWM signal and fourth frame of the second PWM signal extracted in S220 are arranged and outputted as the third PWM signal (S230).

Until n is N, the steps S220 through S250 are repeated to generate the third PWM signals.

Referring back to FIG. 4, the third PWM signal generated (S200) drives a switch to produce a digital audio signal (S300).

The interleaving method of the digital audio signal according to the present invention shown in FIGS. 4 through 6 may also be described as follows.

When the period of the first PWM signal having the carrier frequency of f is $T_1$, the period of the second PWM signal is $T_2$ (=$m \times T_1$).

From the first PWM signal, m frames having a duration corresponding to $T_2$, that is, first frame to $m^{th}$ frame, $(2m+1)^{th}$ frame through $(3m)^{th}$ frame, $(4m+1)^{th}$ frame through $(5m)^{th}$ frame, $(6m+1)^{th}$ frame through $(7m)^{th}$ frame . . . are extracted, and second frame, fourth frame, sixth frame, eighth frame . . . are extracted from the second PWM signal.

Frames extracted from the first PWM signal and the second PWM signal are interleaved to generate the third PWM signal. Specifically, the frames are interleaved in the following sequence: first frame to $m^{th}$ frame of the first PWM signal, second frame of the second PWM signal, $(2m+1)^{th}$ frame through $(3m)^{th}$ frame of the first PWM signal, fourth frame of the second PWM signal, $(4m+1)^{th}$ frame through $(5m)^{th}$ frame of the first PWM signal, sixth frame of the second PWM signal, $(6m+1)^{th}$ frame through $(7m)^{th}$ frame of the first PWM signal, eighth frame of the second PWM signal . . . to generate the third PWM signal.

Therefore, the period of the third PWM signal is $m \times T_1 + T_2 (=2m \times T_1)$ and the carrier frequency thereof is f/2m. As the carrier frequency of the third PWM signal is f/2m, the period of the energy spectrum appearing in frequency domain is ½m times of the period of the energy spectrum of the first PWM signal having the carrier frequency of f. However, since the total amount of energy remains constant, the peak of the energy spectrum is reduced and therefore, the interference with an RF signal is reduced as well.

Hereinafter, the embodiment of the present invention when m=2, 4, and 8 will be described in detail with reference to the accompanying drawings. However, as the steps S100 and S300 are already described in detail with reference to FIG. 4, a further description thereof is omitted.

<m=2>

Figure 7:
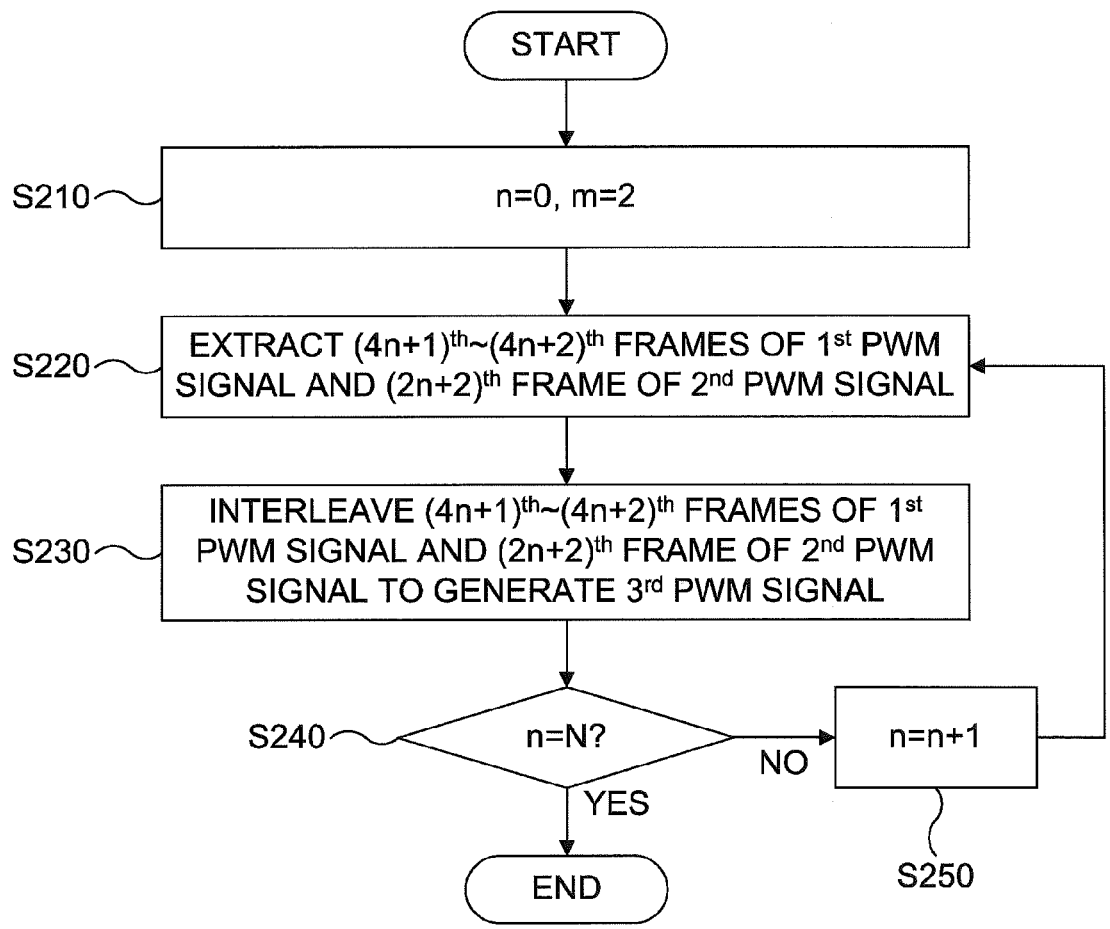
FIG. 7 is a flow diagram illustrating an embodiment of the present invention when m=2.
Figure 8:
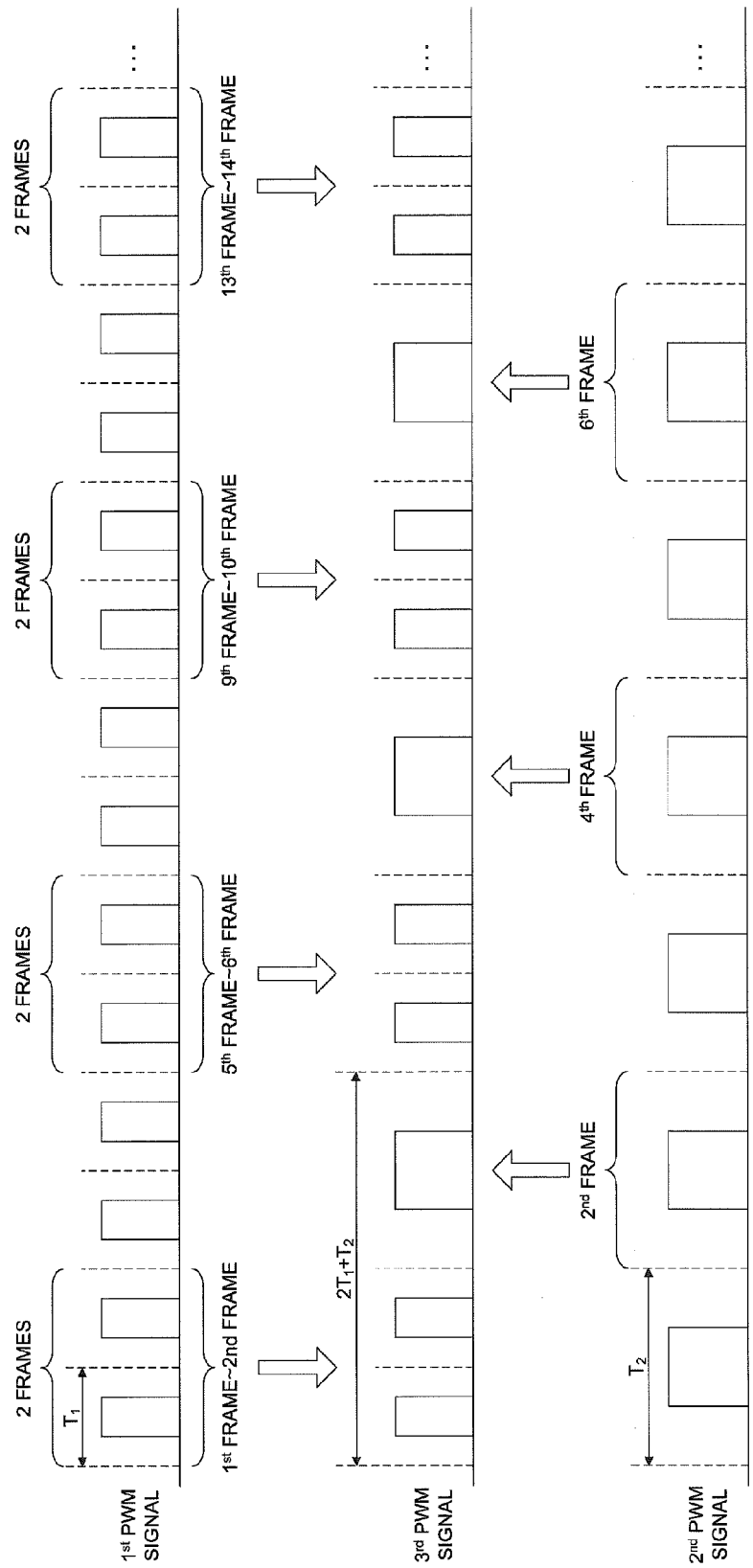
FIG. 8 is a waveform diagram illustrating the embodiment of the present invention when m=2.

FIG. 7 is a flow diagram illustrating step S200 when m=2, and FIG. 8 is a waveform diagram illustrating a waveform when m=2.

Referring to FIGS. 7 and 8, the carrier frequency f of the first PWM signal is divided to generate the second PWM signal having the carrier frequency of f/2.

Thereafter, since an initial value of n is 0 (S210), first frame and second frame of the first PWM signal and second frame of the second PWM signal are extracted (S220).

Thereafter, in step 230, the first and second frame of the first PWM signal and second frame of the second PWM signal extracted in S220 are arranged and outputted as the third PWM signal.

Thereafter, n is set to 1 (S240, S250).

Thereafter, fifth frame and sixth frame of the first PWM signal and fourth frame of the second PWM signal are extracted (S220).

Thereafter, fifth frame and sixth frame of the first PWM signal and fourth frame of the second PWM signal extracted in S220 are arranged and outputted as the third PWM signal (S230).

Until n is N, the steps S220 through S250 are repeated to generate the third PWM signal. Specifically, ninth frame and tenth frame, thirteenth frame and fourteenth frame . . . of the first PWM signal and sixth frame, eighth frame . . . of the second PWM signal are extracted and then interleaved in the following sequence: ninth frame and tenth frame of the first PWM signal, sixth frame of the second PWM signal, the thirteenth and fourteenth frame of the first PWM signal, eighth frame of the second PWM signal to generate the third PWM signal.

When m=2, the period of the third PWM signal is $4T_1$ ($=2T_1+T_2$) and the period of the energy spectrum appearing in frequency domain is ¼ times of the period of the energy spectrum of the first PWM signal having the carrier frequency of f. However, since the total amount of energy remains the same, the peak of the energy spectrum is reduced and therefore, the interference with an RF signal is reduced as well.

<m=4>

Figure 9:
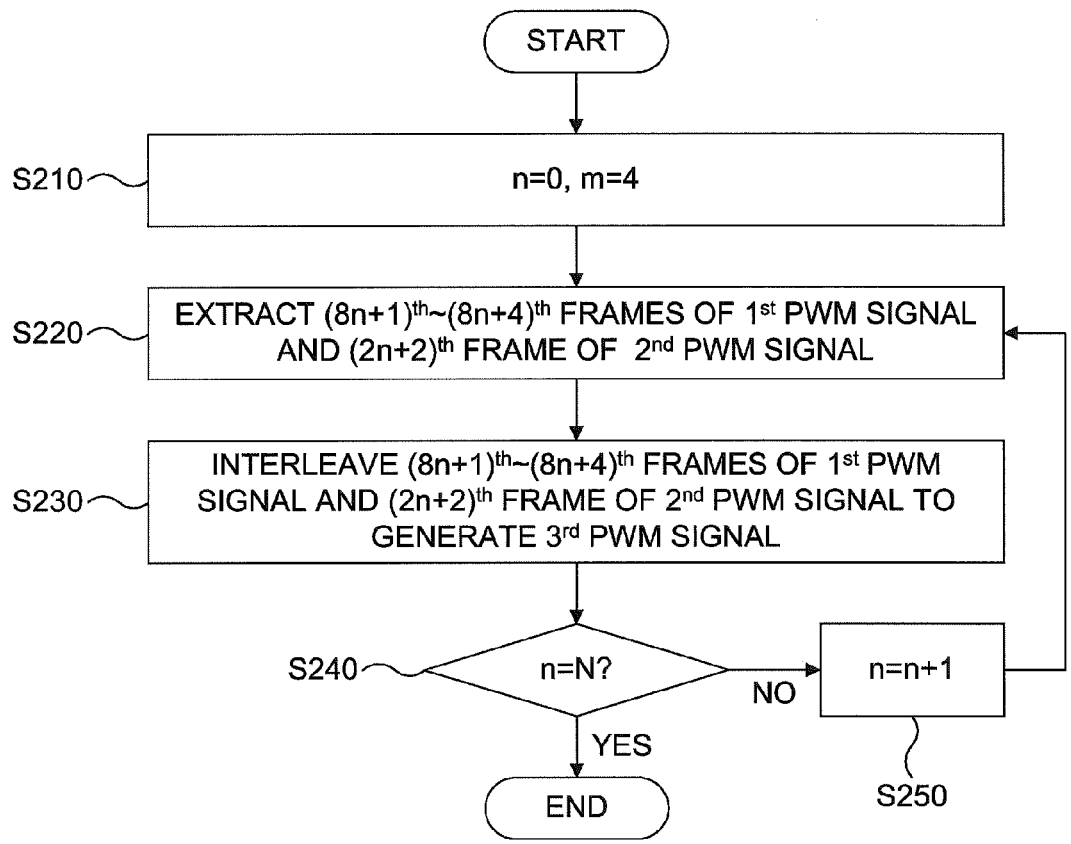
FIG. 9 is a flow diagram illustrating the embodiment of the present invention when m=4.
Figure 10:
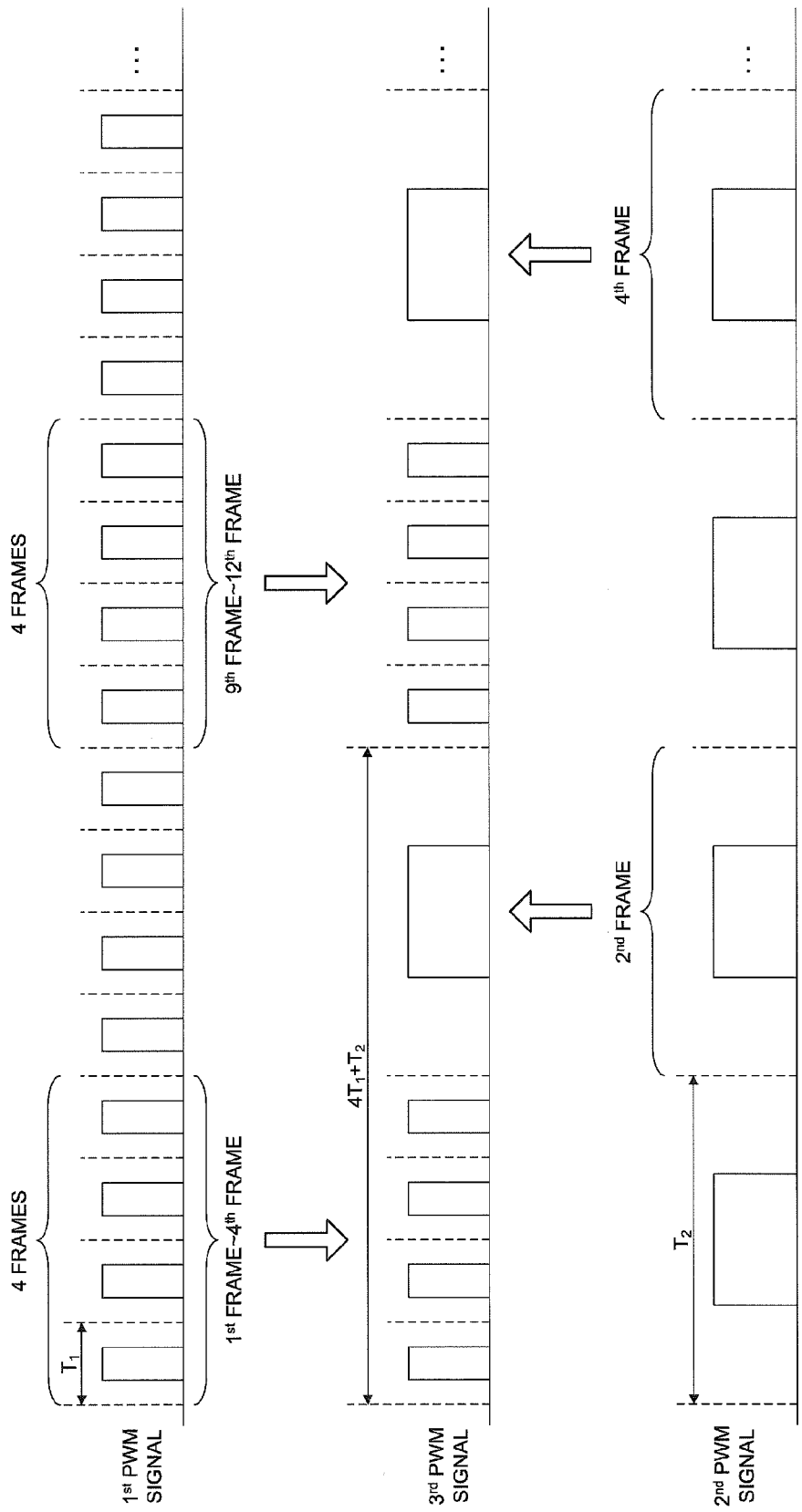
FIG. 10 is a waveform diagram illustrating the embodiment of the present invention when m=4.

FIG. 9 is a flow diagram illustrating step S200 when m=4, and FIG. 10 is a waveform diagram illustrating a waveform when m=4.

Referring to FIGS. 9 and 10, the carrier frequency f of the first PWM signal is divided to generate the second PWM signal having the carrier frequency of f/4.

Thereafter, since an initial value of n is 0 (S210), first frame through fourth frame of the first PWM signal and second frame of the second PWM signal are extracted (S220).

Thereafter, first frame through fourth frame of the first PWM signal and second frame of the second PWM signal extracted in S220 are arranged and outputted as the third PWM signal (S230).

Thereafter, n is set to 1 (S240, S250).

Thereafter, ninth frame through twelfth frame of the first PWM signal and fourth frame of the second PWM signal are extracted (S220).

Thereafter, ninth frame through twelfth frame of the first PWM signal and fourth frame of the second PWM signal extracted in S220 are arranged and outputted as the third PWM signal (S230).

Until n is N, the steps S220 through S250 are repeated to generate the third PWM signal. Specifically, seventeenth frame through twentieth frame, twenty-fifth frame through twenty-eighth frame . . . of the first PWM signal and sixth frame, eighth frame . . . of the second PWM signal are extracted and then interleaved in the following sequence: seventeenth frame through twentieth frame of the first PWM signal, sixth frame of the second PWM signal, twenty-fifth frame through twenty-eighth frame of the first PWM signal, eighth frame of the second PWM signal . . . to generate the third PWM signal.

When m=4, the period of the third PWM signal is $8T_1$ (=$4T_1+T_2$) and the period of the energy spectrum appearing in frequency domain is ⅛ times of the period of the energy spectrum of the first PWM signal having the carrier frequency of f. However, since the total amount of energy remains the same, the peak of the energy spectrum is reduced and therefore, the interference with an RF signal is reduced as well.

<m=8>

Figure 11:
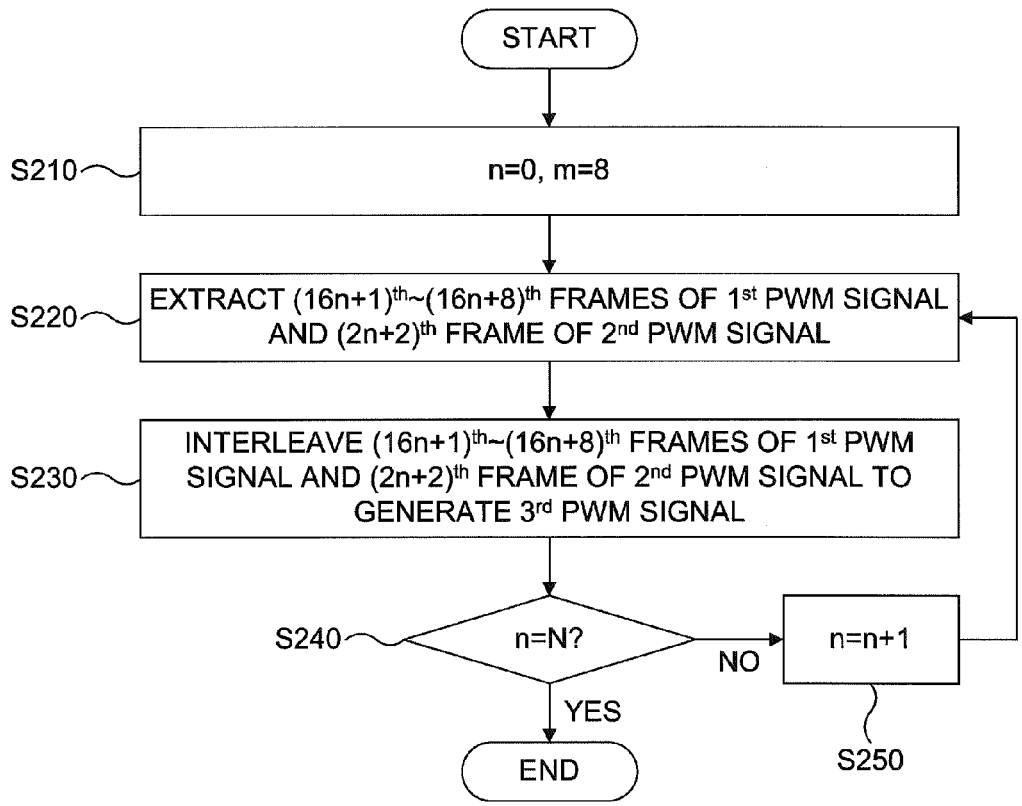
FIG. 11 is a flow diagram illustrating the embodiment of the present invention when m=8.
Figure 12:
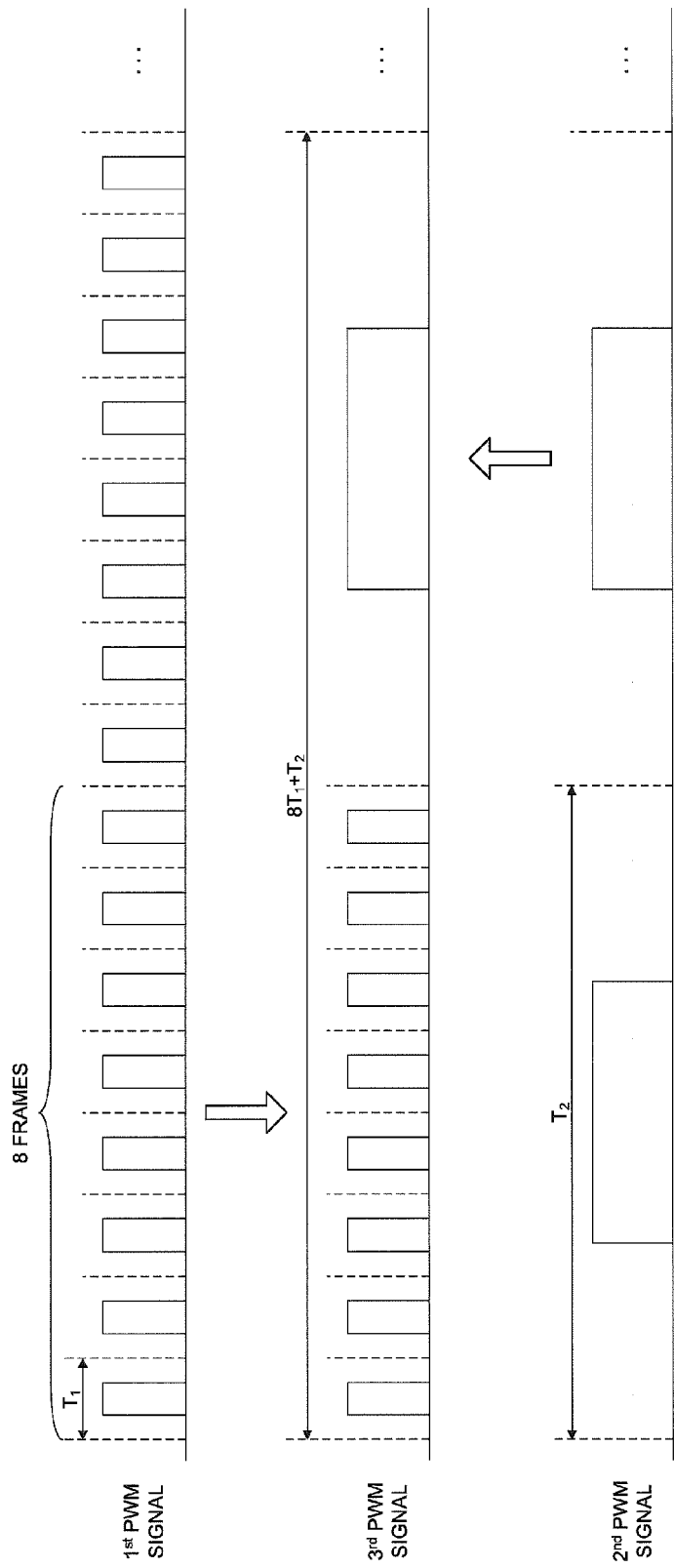
FIG. 12 is a waveform diagram illustrating the embodiment of the present invention wherein m=8.

FIG. 11 is a flow diagram illustrating step S200 when m=8, and FIG. 12 is a waveform diagram illustrating a waveform when m=8.

Referring to FIGS. 11 and 12, the carrier frequency f of the first PWM signal is divided to generate the second PWM signal having the carrier frequency of f/8.

Thereafter, since an initial value of n is 0 (S210), first frame through eighth frame of the first PWM signal and second frame of the second PWM signal are extracted (S220).

Thereafter, first frame through eighth frame of the first PWM signal and second frame of the second PWM signal extracted in step the S220 are arranged and outputted as the third PWM signal (S230).

Thereafter, n is set to 1 (S240, S250).

Thereafter, seventeenth frame through twenty-fourth frame of the first PWM signal and fourth frame of the second PWM signal are extracted (S220).

Thereafter, seventeenth frame through twenty-fourth frame of the first PWM signal and fourth frame of the second PWM signal extracted in step the S220 are arranged and outputted as the third PWM signal (S230).

Until n is N, the steps S220 through S250 are repeated to generate the third PWM signal. Specifically, thirty-third frame through fortieth frame, forty-ninth frame through fifty-sixth frame . . . of the first PWM signal and sixth frame, eighth frame . . . of the second PWM signal are extracted and then interleaved in the following sequence: thirty-third frame through fortieth frame of the first PWM signal, sixth frame of the second PWM signal, forty-ninth frame through fifty-sixth frame of the first PWM signal, eighth frame of the second PWM signal . . . to generate the third PWM signal.

When m=8, the period of the third PWM signal is $16T_1$ (=$8T_1+T_2$) and the period of the energy spectrum appearing in frequency domain is 1/16 times of the period of the energy spectrum of the first PWM signal having the carrier frequency of f. However, since the total amount of energy remains the same, the peak of the energy spectrum is reduced and therefore, the interference with an RF signal is reduced as well.

Figure 13:
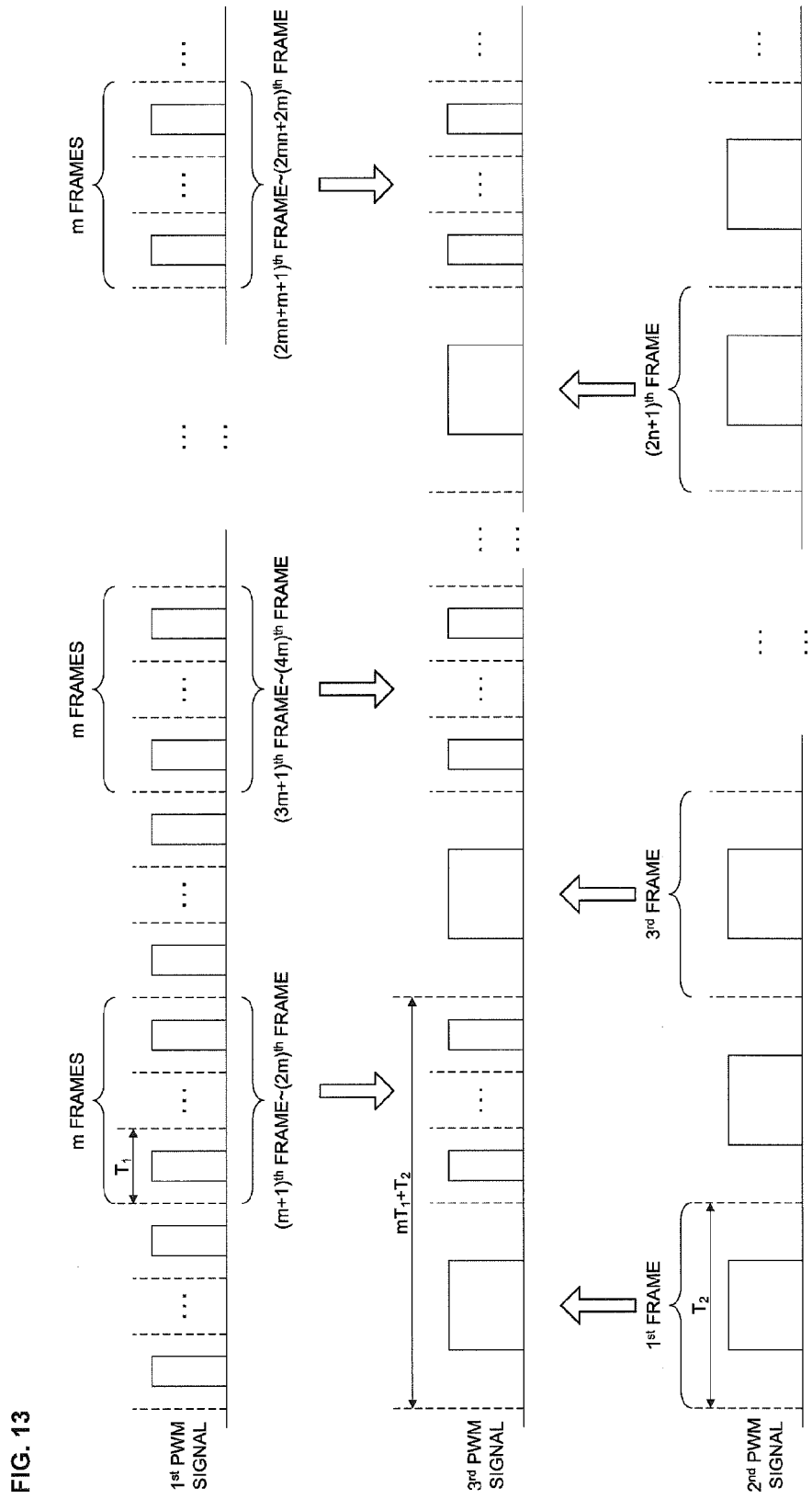
FIG. 13 is a waveform diagram illustrating another embodiment of the present invention.

According to the embodiments described, the third PWM signal is generated by interleaving the frames of the second PWM signal between the frames of the first PWM signal. However, as shown in FIG. 13, the third PWM signal may also be generated by interleaving the frame of the first PWM signal between the frames of the second PWM signal.

Specifically, first frame, third frame, fifth frame . . . and $(2n+1)^{th}$ frame of the second PWM signal generated by frequency-dividing the first PWM signal and $(m+1)^{th}$ frame through $(2m)^{th}$ frame, $(3m+1)^{th}$ frame through $(4m)^{th}$ frame, $(5m+1)^{th}$ frame through $(6m)^{th}$ frame . . . and $(2mn+m+1)^{th}$ frame through $(2mn+2m)^{th}$ frame of the first PWM signal are extracted and then interleaved in the following sequence: first frame of the second PWM signal, $(m+1)^{th}$ frame through $(2m)^{th}$ frame of the first PWM signal, third frame of the second PWM signal, $(3m+1)^{th}$ frame through $(4m)^{th}$ frame of the first PWM signal, fifth frame of the second PWM signal, $(5m+1)^{th}$ frame through $(6m)^{th}$ frame of the first PWM signal . . . , $(2n+1)^{th}$ frame of the second PWM signal, and $(2mn+m+1)^{th}$ frame through $(2mn+2m)^{th}$ frame of the first PWM signal, to generate the third PWM signal. The interleaving method illustrated in FIG. 13 may also be applied to the interleaving system and a digital audio processing device according to the present invention.

Figure 14:
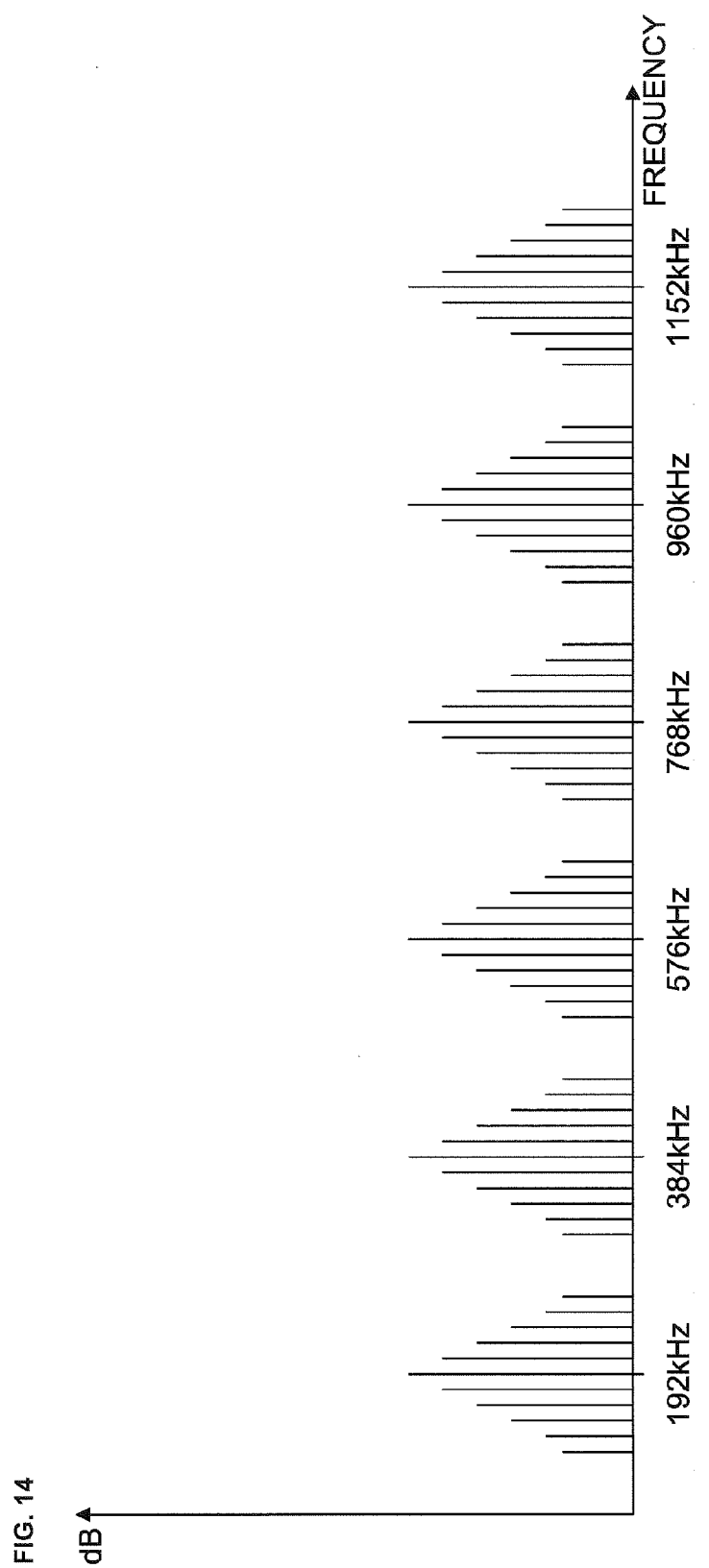
FIG. 14 is a graph illustrating an energy spectrum according to the present invention.

FIG. 14 is a graph illustrating an energy spectrum according to the present invention when the carrier frequency of the first PWM signal is 768 kHz and m=2.

Referring to FIG. 14, since the carrier frequency of the first PWM signal is 768 kHz and m=2, the carrier frequency of the second PWM signal is 384 kHz. Therefore, the energy spectrum appears at every 192 kHz. Since the total amount of energy remains the same, the peak of the energy spectrum is reduced. Therefore, the interference affecting AM radio signal is reduced as well.

Hereinafter, a digital audio processing device employing an interleaving method according to the present invention will be described in detail.

Figure 15:
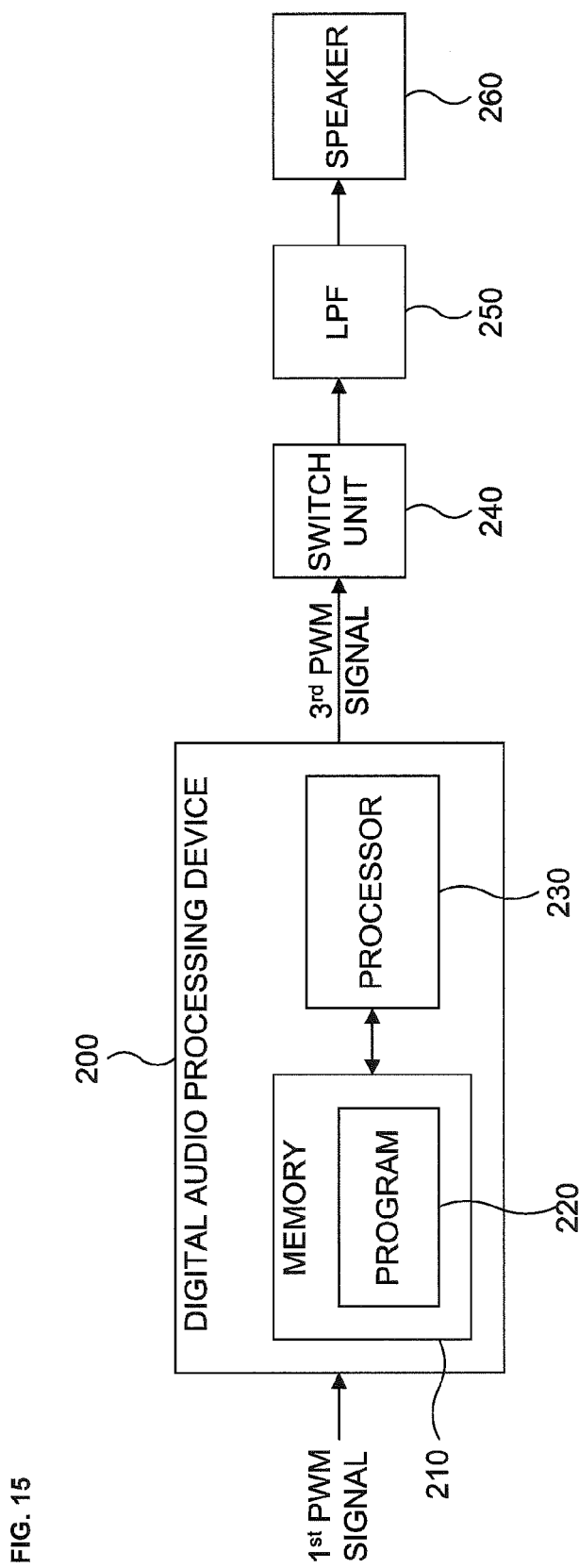
FIG. 15 is a block diagram illustrating a digital audio processing device according to the present invention.

FIG. 15 is a block diagram illustrating a digital audio processing device according to the present invention. Referring to FIG. 15, a digital audio processing device 200 of the present invention includes: a memory 210; a program 220 stored in the memory 210; and a processor 230 configured to execute a plurality of instructions included in the program 220. The program 220 includes the plurality of instructions and the processor 230 executes the plurality of instructions such that the digital audio processing device 200 of the present invention performs the interleaving method according to the present invention. That is, the processor 230 executes the plurality of instructions included in the program 220 such that the digital audio processing device 200 of the present invention generates the third PWM signal from the first PWM signal.

Figure 16:
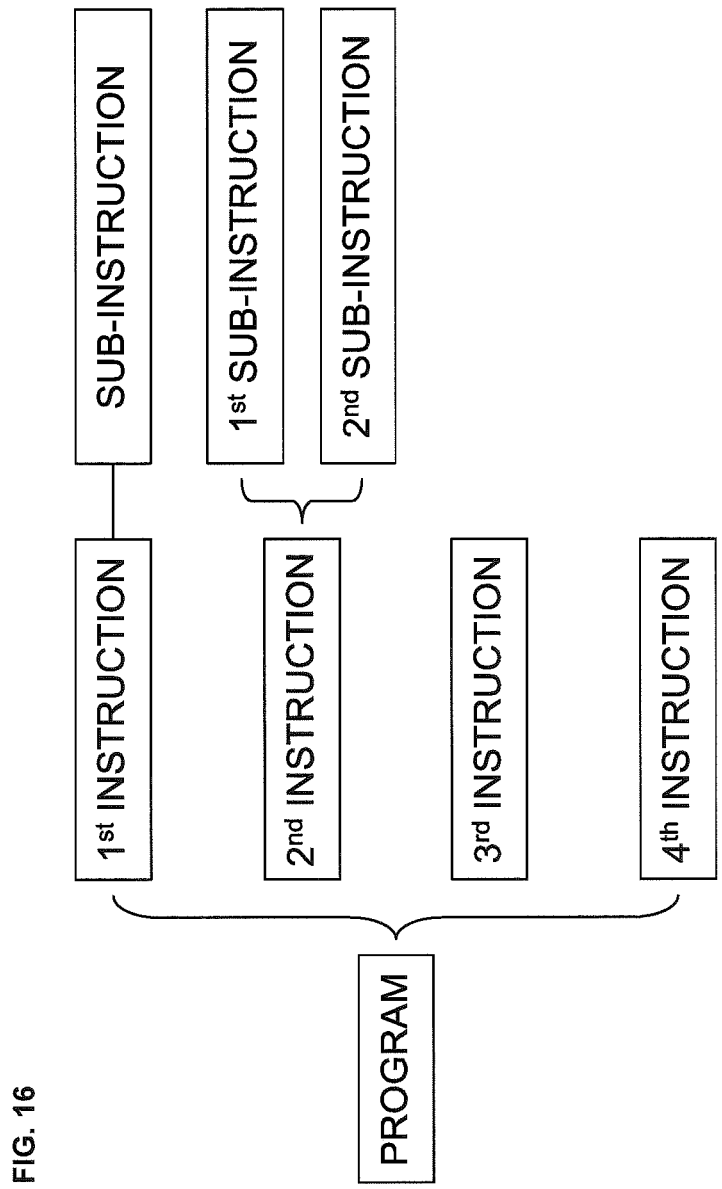
FIG. 16 is a block diagram illustrating program of a digital audio processing device according to the present invention.

As shown in FIG. 16, the program 220 includes a first instruction through a fourth instruction executed by the processor 230.

The processor 230 reads the program 220 stored in the memory 210 to execute the first instruction. Specifically, according to the first instruction, the processor 230 divides the carrier frequency f of the first PWM signal to generate the second PWM signal having the carrier frequency of f/m.

Thereafter, the processor 230 executes the second instruction to extract $(2 \times m \times n+1)^{th}$ frame through $(2 \times m \times n+m)^{th}$ frame from the first PWM signal and $(2n+^2)^{th}$ frame from the second PWM signal.

As shown in FIG. 16, the second instruction may include: a first sub-instruction, when executed by the processor 230, for extracting $(2 \times m \times n+1)^{th}$ frame through $(2 \times m \times n+m)^{th}$ frame from the first PWM signal for each value of n; and a second sub-instruction, when executed by the processor 230, for extracting, $(2n+2)^{th}$ frame from the second PWM signal for each value of n.

Thereafter, the processor 230 generates the third PWM signal by executing the third instruction by interleaving $(2 \times m \times n+1)^{th}$ frame through $(2 \times m \times n+m)^{th}$ frame of the first PWM signal and $(2n+2)^{th}$ frame of the second PWM signal.

The third instruction may include, when executed by the processor 230, a sub-instruction for interleaving $(2 \times m \times n+1)^{th}$ frame through $(2 \times m \times n+m)^{th}$ frame of the first PWM signal and $(2n+2)^{th}$ frame of the second PWM signal extracted by executing the second instruction to generate the third PWM signal.

The processor 230 executes the fourth instruction to transmit the third PWM signal to the switch unit 240 to drive the switch unit 240 by the third PWM signal. An output from the switch unit 240 is passed through the low pass filter 250 to drive the speaker 260.

As the interleaving method for generating the third PWM signal from the first PWM signal and the second PWM signal for each m and n is already described in detail in this specification, further description thereof is omitted. In addition, it should be understood that various embodiments of the interleaving method according to the present invention can be applied to the digital audio processing device of the present invention.

The present invention can reduce interference with an RF signal by interleaving a digital audio signal including a PWM signal to reduce a peak in an energy spectrum.

What is claimed is:

1. A method for interleaving a digital audio signal including a first PWM signal having a carrier frequency of f, the method comprising:
   (a) generating a second PWM signal having a carrier frequency of f/m by dividing the carrier frequency of the first PWM signal by m;
   (b) generating a third PWM signal by extracting $(2 \times m \times n+1)^{th}$ frame through $(2 \times m \times n+m)^{th}$ frame from the first PWM signal and $(2n+2)^{th}$ frame from the second PWM signal; and
   (c) reproducing the digital audio signal by driving a switch with the third PWM signal (where $m=2^k$, and each of n and k is an integer equal to or greater than 0).

2. The method of claim 1, wherein the step (b) comprises:
   (b-1) extracting the $(2 \times m \times n+1)^{th}$ frame through the $(2 \times m \times n+m)^{th}$ frame from the first PWM signal and the $(2n+2)^{th}$ frame from the second PWM signal for each value of n; and
   (b-2) interleaving the $(2 \times m \times n+1)^{th}$ frame through the $(2 \times m \times n+m)^{th}$ frame of the first PWM signal and the $(2n+2)^{th}$ frame of the second PWM signal to generate the third PWM signal.

3. The method of claim 1, wherein m=2, and the step (b) comprises:
   (b-1) extracting: first frame and second frame; fifth frame and sixth frame; ninth frame and tenth frame; and thirteenth frame and fourteenth frame from the first PWM signal;
   (b-2) extracting: second frame; fourth frame; sixth frame; and eighth frame from the second PWM signal; and
   (b-3) sequentially arranging: the first frame and the second frame of the first PWM signal; the second frame of the second PWM signal; the fifth frame and the sixth frame of the first PWM signal; the fourth frame of the second PWM signal; the ninth frame and the tenth frame of the first PWM signal; the sixth frame of the second PWM signal; the thirteenth frame and the fourteenth frame of the first PWM signal; and the eighth frame of the second PWM signal to generate the third PWM signal.

4. The method of claim 1, wherein m=4, and the step (b) comprises:
   (b-1) extracting: first frame through fourth frame; ninth frame through twelfth frame; seventeenth frame through twentieth frame; and twenty-fifth frame through twenty-eighth frame from the first PWM signal;
   (b-2) extracting: second frame; fourth frame; sixth frame; and eighth frame from the second PWM signal; and
   (b-3) sequentially arranging: the first frame through the fourth frame of the first PWM signal; the second frame of the second PWM signal; the ninth frame through the twelfth frame of the first PWM signal; the fourth frame of the second PWM signal; the seventeenth frame through the twentieth frame of the first PWM signal; the sixth frame of the second PWM signal; the twenty-fifth frame through the twenty-eighth frame of the first PWM signal; and the eighth frame of the second PWM signal to generate the third PWM signal.

5. The method of claim 1, wherein m=8, and the step (b) comprises:
   (b-1) extracting first frame through eighth frame; seventeenth frame through twenty-fourth frame; thirty-third frame through fortieth frame; and forty-ninth frame through fifty-sixth frame from the first PWM signal;
   (b-2) extracting second frame; fourth frame; sixth frame; and eighth frame from the second PWM signal; and
   (b-3) sequentially arranging: the first frame through the eighth frame of the first PWM signal; the second frame of the second PWM signal; the seventeenth frame through the twenty-fourth frame of the first PWM signal; the fourth frame of the second PWM signal; the thirty-third frame through the fortieth frame of the first PWM signal; the sixth frame of the second PWM signal; the forty-ninth frame through the fifty-sixth frame of the first PWM signal; and the eight frame of the second PWM signal, to generate the third PWM signal.

6. A method for interleaving a digital audio signal including a first PWM signal having a period of $T_1$, the method comprising:
   (a) generating a second PWM signal having a period of $T_2$ by frequency-dividing the first PWM signal by m;
   (b) extracting, from the first PWM signal, $(2 \times m \times n+1)^{th}$ frame through $(2 \times m \times n+m)^{th}$ frame wherein a sum of durations of the $(2 \times m \times n+1)^{th}$ frame through the $(2 \times m \times n+m)^{th}$ frame corresponding to the period of $T_2$;
   (c) extracting $(2n+2)^{th}$ frame from the second PWM signal;
   (d) generating the third PWM signal having the period of $(m \times T_1+T_2)$ by interleaving the $(2 \times m \times n+1)^{th}$ frame through the $(2 \times m \times n+m)^{th}$ frame of the first PWM signal and the $(2n+2)^{th}$ frame of the second PWM signal; and
   (e) reproducing the digital audio signal by driving a switch with the third PWM signal (where $T_2=m \times T_1$, $m=2^k$ and each of n and k is an integer equal to or greater than 0).

7. The method of claim 6, wherein the $(2 \times m \times n+1)^{th}$ frame through the $(2 \times m \times n+m)^{th}$ frame of the first PWM signal and the $(2n+2)^{th}$ frame of the second PWM signal are extracted for each value of n in the steps (b) and (c), respectively, and the $(2\times m\times n+1)^{th}$ frame through the $(2\times m\times n+m)^{th}$ frame of the first PWM signal and the $(2n+2)^{th}$ frame of the second PWM signal are interleaved in the step (d) to generate the third PWM signal.

8. The method of claim 6, wherein m=2, and
wherein the step (b) comprises extracting: first frame and second frame; fifth frame and sixth frame; ninth frame and tenth frame; and thirteenth frame and fourteenth frame from the first PWM signal;
the step (c) comprises extracting: second frame; fourth frame; sixth frame; and eighth frame from the second PWM signal; and
the step (d) comprises sequentially arranging: the first frame and second frame of the first PWM signal; the second frame of the second PWM signal; the fifth frame the sixth frame of the first PWM signal; the fourth frame of the second PWM signal; the ninth frame the tenth frame of the first PWM signal; the sixth frame of the second PWM signal; the thirteenth frame and fourteenth frame of the first PWM signal; and eighth frame of the second PWM signal to generate the third PWM signal.

9. The method of claim 6, wherein m=4, and
wherein the step (b) comprises extracting: first frame through fourth frame; ninth frame through twelfth frame; seventeenth frame through twentieth frame; and twenty-fifth frame through twenty-eighth frame from the first PWM signal;
the step (c) comprises extracting: second frame; fourth frame; sixth frame; and eighth frame from the second PWM signal; and
the step (d) comprises sequentially arranging: the first frame through the fourth frame of the first PWM signal; the second frame of the second PWM signal; the ninth frame through the twelfth frame of the first PWM signal; the fourth frame of the second PWM signal; the seventeenth frame through the twentieth frame of the first PWM signal; the sixth frame of the second PWM signal; the twenty-fifth frame through the twenty-eighth frame of the first PWM signal; and the eighth frame of the second PWM signal to generate the third PWM signal.

10. The method of claim 6, wherein m=8, and
wherein the step (b) comprises extracting: first frame through eighth frame; seventeenth frame through twenty-fourth frame; thirty-third frame through fortieth frame; and forty-ninth frame through fifty-sixth frame from the first PWM signal in (b);
the step (c) comprises extracting: second frame; fourth frame; sixth frame; and eighth frame from the second PWM signal; and
the step (d) comprises sequentially arranging: the first frame through the eighth frame of the first PWM signal; the second frame of the second PWM signal; the seventeenth frame through the twenty-fourth frame of the first PWM signal; the fourth frame of the second PWM signal; the thirty-third frame through the fortieth frame of the first PWM signal; the sixth frame of the second PWM signal; the forty-ninth frame through the fifty-sixth frame of the first PWM signal; and eighth frame of the second PWM signal to generate the third PWM signal.

11. A system for interleaving a digital audio signal including a first PWM signal having a carrier frequency of f, the system comprising:

a frequency divider configured to divide the carrier frequency of the first PWM signal by m to generate a second PWM signal having a carrier frequency of f/m;
a frame extracting unit configured to extract $(2\times m\times n+1)^{th}$ frame through $(2\times m\times n+m)^{th}$ frame from the first PWM signal and $(2n+2)^{th}$ frame from the second PWM signal;
a frame arranging unit configured to interleave the $(2\times m\times n+1)^{th}$ frame through the $(2\times m\times n+m)^{th}$ frame of the first PWM signal and the $(2n+2)^{th}$ frame of the second PWM signal extracted by the frame extracting unit to generate a third PWM signal; and
a switch unit driven by the third PWM signal (where $m=2^k$ and each of n and k is an integer equal to or greater than 0).

12. The system of claim 11, wherein the frame extracting unit is configured to extract, for each value of n, the $(2\times m\times n+1)^{th}$ frame through the $(2\times m\times n+m)^{th}$ frames from the first PWM signal and the $(2n+2)^{th}$ frame from the second PWM signal, and
the frame arranging unit is configured to interleave the $(2\times m\times n+1)^{th}$ frame through the $(2\times m\times n+m)^{th}$ frame of the first PWM signal and the $(2n+2)^{th}$ frame of the second PWM signal to generate the third PWM signal.

13. The system of claim 11, wherein m=2, and
wherein the frame extracting unit is configured to extract: first frame and second frame; fifth frame and sixth frame; ninth frame and tenth frame; and thirteenth frame and fourteenth frame from the first PWM signal, and second frame; fourth frame; sixth; and eighth frame from the second PWM signal frame, and
the frame arranging unit is configured to sequentially arrange: the first frame and the second frame of the first PWM signal; the second frame of the second PWM signal; the fifth frame and the sixth frame of the first PWM signal; the fourth frame of the second PWM signal; the ninth frame and the tenth frame of the first PWM signal; the sixth frame of the second PWM signal; the thirteenth frame and the fourteenth frame of the first PWM signal; and the eighth frame of the second PWM signal to generate the third PWM signal.

14. The system of claim 11, wherein m=4, and
wherein the frame extracting unit is configured to extract: a first frame through fourth frame, ninth frame through twelfth frame, seventeenth frame through twentieth frame, and twenty-fifth frame through twenty-eighth frame from the first PWM signal, and second frame; fourth frame; sixth frame; and eighth frame from the second PWM signal, and
the frame arranging unit is configured to sequentially arrange: the first frame through the fourth frame of the first PWM signal; the second frame of the second PWM signal; the ninth frame through the twelfth frame of the first PWM signal; the fourth frame of the second PWM signal; the seventeenth frame through the twentieth frame of the first PWM signal; the sixth frame of the second PWM signal; the twenty-fifth frame through the twenty-eighth frame of the first PWM signal; and the eighth frame of the second PWM signal to generate the third PWM signal.

15. The system of claim 11, wherein m=8,
the frame extracting unit is configured to extract: first frame through eighth frame, seventeenth frame through twenty-fourth frame, thirty-third frame through fortieth frame; and forty-ninth frame through fifty-sixth frame from the first PWM signal, and second frame; fourth frame; sixth frame; and eighth frame from the second PWM signal, and the frame arranging unit is configured to sequentially arrange: the first frame through the eighth frame of the first PWM signal; the second frame of the second PWM signal; the seventeenth frame through the twenty-fourth frame of the first PWM signal; the fourth frame of the second PWM signal; the thirty-third frame through the fortieth frame of the first PWM signal; the sixth frame of the second PWM signal; the forty-ninth frame through the fifty-sixth frame of the first PWM signal; and eighth frame of the second PWM signal to generate the third PWM signal.

16. A digital audio processing device comprising: a memory; a program stored in the memory; and a processor configured to execute an instruction included in the program, wherein the program comprises:

a first instruction for generating a second PWM signal having a carrier frequency of f/m by frequency-dividing a first PWM signal having a carrier frequency of f;

a second instruction for extracting $(2 \times m \times n+1)^{th}$ frame through $(2 \times m \times n+m)^{th}$ frame from the first PWM signal and $(2n+2)^{th}$ frame from the second PWM signal;

a third instruction for generating a third PWM signal by interleaving the $(2 \times m \times n+1)^{th}$ frame through the $(2 \times m \times n+m)^{th}$ frame of the first PWM signal and the $(2n+2)^{th}$ frame of the second PWM signal; and a fourth instruction for driving a switch with the third PWM signal (where $m=2^k$ and each of n and k is an integer equal to or greater than 0).

17. The digital audio processing device of claim 16, wherein the second instruction comprises: a first sub-instruction for extracting, for each value of n, the $(2 \times m \times n+1)^{th}$ frame through the $(2 \times m \times n+m)^{th}$ frame from the first PWM signal; and a second sub-instruction for extracting, for each value of n, the $(2n+2)^{th}$ frame from the second PWM signal, and the third instruction comprises a sub-instruction for interleaving the $(2 \times m \times n+1)^{th}$ frame through the $(2 \times m \times n+m)^{th}$ frame of the first PWM signal and the $(2n+2)^{th}$ frame of the second PWM signal to generate the third PWM signal.

18. A method for interleaving a digital audio signal including a first PWM signal having a carrier frequency of f, the method comprising:

(a) generating a second PWM signal having a carrier frequency of f/m by frequency-dividing the first PWM signal;

(b) generating a third PWM signal by extracting $(2n+1)^{th}$ frame from the second PWM signal and $(2 \times m \times n+m+1)^{th}$ frame through $(2 \times m \times n+2m)^{th}$ frame from the first PWM signal; and (c) reproducing the digital audio signal by driving a switch with the third PWM signal (where $m=2^k$ and each of n and k is an integer equal to or greater than 0).

19. A method for interleaving a digital audio signal including a first PWM signal having a period of $T_1$, the method comprising:

(a) generating a second PWM signal having a period of $T_2$ by frequency-dividing the first PWM signal by m;

(b) extracting $(2n+2)^{th}$ frame from the second PWM signal;

(c) extracting, from the first PWM signal, $(2 \times m \times n+1)^{th}$ frame through $(2 \times m \times n+m)^{th}$ frame wherein a sum of durations of the $(2 \times m \times n+1)^{th}$ frame through the $(2 \times m \times n+m)^{th}$ frame corresponding to the period of $T_2$;

(d) generating the third PWM signal having the period of $(m \times T_1+T_2)$ by interleaving $(2n+1)^{th}$ frame of the second PWM signal and $(2 \times m \times n+m+1)^{th}$ frame through $(2 \times m \times n+2m)^{th}$ frame of the first PWM signal; and (e) reproducing the digital audio signal by driving a switch with the third PWM signal (where $T_2=m \times T_1$, $m=2^k$, and each of n and k is an integer equal to or greater than 0).

* * * * *